United States Patent

Hishiro et al.

[11] Patent Number: 5,876,895
[45] Date of Patent: Mar. 2, 1999

[54] PHOTOSENSITIVE RESIN COMPOSITION FOR COLOR FILTER

[75] Inventors: Yoshiki Hishiro, Toyonaka; Naoki Takeyama, Settsu; Shigeki Yamamoto, Ibaraki, all of Japan

[73] Assignee: Sumitomo Chemical Company, Limited, Osaka, Japan

[21] Appl. No.: 653,122

[22] Filed: May 24, 1996

Related U.S. Application Data

[63] Continuation of Ser. No. 284,434, filed as PCT/JP93/01872 published as WO94/14892 Jul. 7, 1994, abandoned.

[30] Foreign Application Priority Data

Dec. 24, 1992 [JP] Japan .................................. 4-344336
Dec. 24, 1992 [JP] Japan .................................. 4-344337
Feb. 4, 1993 [JP] Japan .................................. 5-017693
Feb. 4, 1993 [JP] Japan .................................. 5-017694

[51] Int. Cl.$^6$ ............................................. G03F 7/023
[52] U.S. Cl. ................... 430/191; 430/165; 430/192; 430/193
[58] Field of Search ...................... 430/191, 192, 430/193, 165

[56] References Cited

U.S. PATENT DOCUMENTS

| | | | |
|---|---|---|---|
| 3,288,864 | 11/1966 | Farnham | 260/619 |
| 4,268,648 | 5/1981 | Freitag et al. | 528/153 |
| 4,366,328 | 12/1982 | Numata et al. | 568/734 |
| 4,387,152 | 6/1983 | Stahlhofen | 430/192 |
| 4,889,788 | 12/1989 | Stahlhofen et al. | 430/192 |
| 4,929,536 | 5/1990 | Spak et al. | 430/193 |
| 5,130,225 | 7/1992 | Uetomi | 430/191 |
| 5,304,456 | 4/1994 | Ueda et al. | 430/270 |
| 5,397,679 | 3/1995 | Ueda et al. | 430/270.1 |

FOREIGN PATENT DOCUMENTS

| | | |
|---|---|---|
| 0460416 | 12/1991 | European Pat. Off. . |
| 0497342 | 8/1992 | European Pat. Off. . |
| 0564997 | 10/1993 | European Pat. Off. . |
| 53-119996 | 10/1978 | Japan . |
| 61-218616 | 9/1986 | Japan . |

*Primary Examiner*—John S. Chu
*Attorney, Agent, or Firm*—Birch, Stewart, Kolasch & Birch, LLP

[57] ABSTRACT

A photosenstive resin composition for color filter having excellent resolution, heat resistance and transparency, etc., characterized in that it contains a novolak resin having the recurring units such as those represented by the general formula (I):

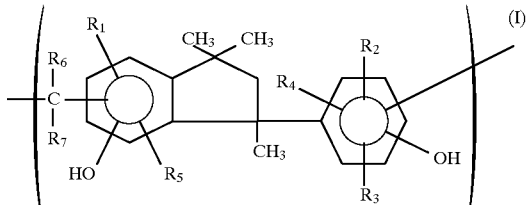

[wherein $R_1$ to $R_5$ represent hydrogen, alkyl, etc., and $R_6$ and $R_7$ represent hydrogen, alkyl, etc., provided that

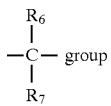

is coordinated at the o- or p-position in relation to the —OH group] and having a molecular weight of about 1,000–50,000, a solvent and a dye or pigment.

5 Claims, No Drawings

PHOTOSENSITIVE RESIN COMPOSITION FOR COLOR FILTER

This application is a continuation, of application Ser. No. 08/284,434, filed as PCT/JP93/01872 published as WO94/14892 Jul. 7, 1994, now abandoned.

FIELD OF ART

This invention relates to the photosensitive resin compositions for color filter, more particularly to the positive and negative photosensitive resin compositions for color filter.

BACKGROUND ART

Color filters, especially those for solid image forming devices such as charge-coupled devices (CCD) and liquid crystal display devices (LCD) are used for forming a pattern of three primary colors (red, green and blue) or three complementary colors (yellow, magenta and cyan) on a transparent or opaque substrate. Regarding the photosensitive resin compositions for such color filters, JP-A-4-175753 and JP-A-4-175754 disclose respectively a photosensitive resin composition for color filter comprising (A) a novolak resin obtained by polycondensing a phenolic material containing 50 mol % or more of bisphenol A and an aldehyde, as an alkali-soluble resin, (B) a light-modifiable dissolution inhibitor, (C) a dye soluble in the solvent (D) and compatible with the resin (A), and (D) a solvent, and a composition comprising (A), (B), (D) and (C') a particulate pigment.

However, use of such positive photosensitive resin compositions for color filter involves the problems of change of pattern shape and discoloration of color filter because of high-temperature and long-time heating that is required after pattern formation.

DISCLOSURE OF THE INVENTION

The present invention provides a photosenstive resin composition for color filter which is excellent in various properties such as resolution, heat resistance and transparency (light transmission properties).

The present invention consists in a photosensitive resin composition for color filter characterized in that it contains a novolak resin having at least one type of recurring unit selected from the group of the recurring units represented by the following general formulae (I)–(III):

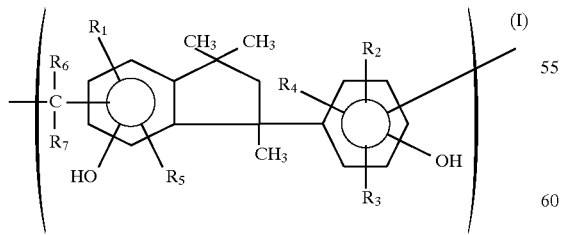
(I)

[wherein $R_1$ to $R_5$ represent independently a hydrogen atom, a halogen atom, a straight-chain or branched alkyl or alkenyl group which may be substituted, or an acetyl group; and $R_6$ and $R_7$ represent independently a hydrogen atom, an alkyl group which may be substituted, a benzyl group or a phenyl group provided that

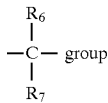

is coordinated at the o- or p-position in relation to the —OH group];

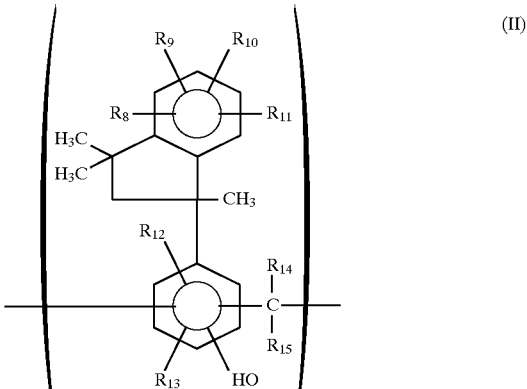
(II)

[wherein $R_8$ to $R_{13}$ represent independently a hydrogen atom, a halogen atom, a straight-chain or branched alkyl or alkenyl group which may be substituted, or an acetyl group; and $R_{14}$ and $R_{15}$ represent independently a hydrogen atom, an alkyl group which may be substituted, a benzyl group or a phenyl group provided that

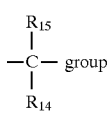

is coordinated at the o- or p-position in relation to the —OH group]; and

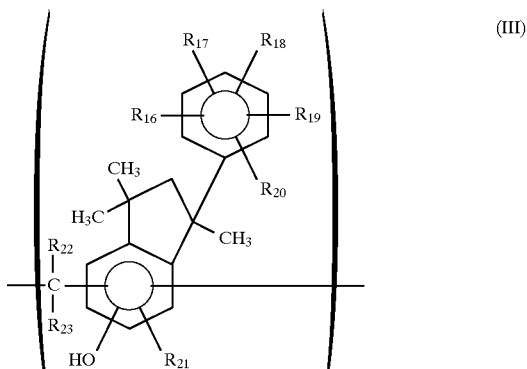
(III)

[wherein $R_{16}$ to $R_{21}$ represent independently a hydrogen atom, a halogen atom, a straight-chain or branched alkyl or alkenyl group which may be substituted, or an acetyl group; and $R_{22}$ and $R_{23}$ represent independently a hydrogen atom, an alkyl group which may be substituted, a benzyl group or aphenyl group provided that

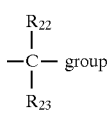

is coordinated at the o- or p-position in relation to the —OH group] and having a molecular weight of about 1,000 to 50,000, a solvent and a dye or a pigment.

BEST MODE FOR CARRYING OUT THE INVENTION

A novolak resin having at least one type of recurring unit selected from the group of the recurring units represented by the general formulae (I), (II) and (III) specified above can be obtained from addition condensation, in the presence of an acid catalyst, of a phenolic compound containing a compound represented by the general formula (IV):

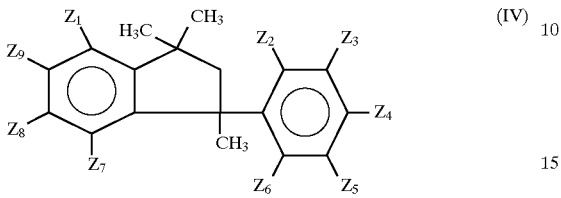

(IV)

wherein $Z_1$ to $Z_9$ represent independently a hydrogen tom, a halogen atom, a straight-chain or branched alkyl or alkenyl group which may be substituted, an acetyl group or —OH group, provided that one of $Z_1$, $Z_7$, $Z_6$ and $Z_5$ is —OH group and at least one hydrogen atom is coordinated at the o- or p-position in relation to said —OH group, and one of $Z_2$ to $Z_6$ is —OH group and at least one hydrogen atom is coordinated at the o- or p-position in relation to said —OH group) and a carbonyl compound. When a phenolic compound containing a compound represented by the general formula (V):

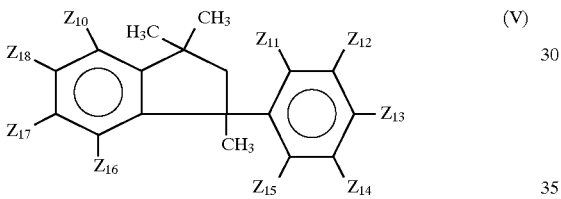

(V)

(wherein $Z_{10}$ to $Z_{18}$ represent independently a hydrogen atom, a halogen atom, a straight-chain or branched alkyl or alkenyl group which may be substituted, an acetyl group or —OH group, provided that one of $Z_{11}$ to $Z_{15}$ is —OH group and at least 2 hydrogen atoms are coordinated at the o- or p-position in relation to said —OH group, and $Z_{10}$, $Z_{16}$, $Z_{17}$ and $Z_{18}$ are not —OH group) and a carbonyl compound are subjected to addition condensation in the presence of an acid catalyst, there can be obtained a novolak resin having the recurring units represented by the above-shown general formula (II). Also, when a phenolic compound containing a compound represented by the following general formula (VI):

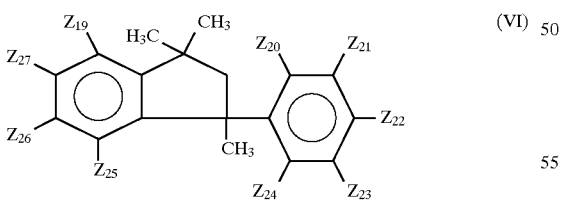

(VI)

(wherein $Z_{19}$ to $Z_{27}$ represent independently a hydrogen atom, a halogen atom, a straight-chain or branched alkyl or alkenyl group which may be substituted, an acetyl group or —OH group, provided that one of $Z_{19}$, $Z_{25}$, $Z_{26}$ and $Z_{27}$ is —OH group and at least 2 hydrogen atoms are coordinated at the o- or p-position in relation to said —OH group, and $Z_{20}$ to $Z_{24}$ are not —OH group) and carbonyl group are subjected to addition condensation in the presence of an acid catalyst, there can be obtained a novolak resin having the recurring units represented by the above-shown general formula (III).

The straight-chain or branched alkyl groups represented by $R_1$ to $R_{23}$ and $Z_1$ to $Z_{27}$ are preferably those having 1 to 5 carbon atoms, and the straight-chain or branched alkenyl groups represented by $R_1$ to $R_5$, $R_8$ to $R_{13}$, $R_{16}$ to $R_{21}$ and $Z_1$ to $Z_{27}$ are preferably those having 2 to 5 carbon atoms. The substituents of these groups may be, for instance, halogen atom, —OH group, —SH group, phenyl group and lower alkylthio group. As $R_1$ to $R_{23}$ and $Z_1$ to $Z_{27}$, hydrogen atom or a straight-chain or branched $C_{1-5}$ alkyl group (such as methyl, ethyl, n-propyl, i-propyl or n-butyl) is preferred. Hydrogen atom or methyl or ethyl group is more preferred. Preferred examples of the compounds represented by the general formulae (IV) to (VI) are those shown below by chemical formulae:

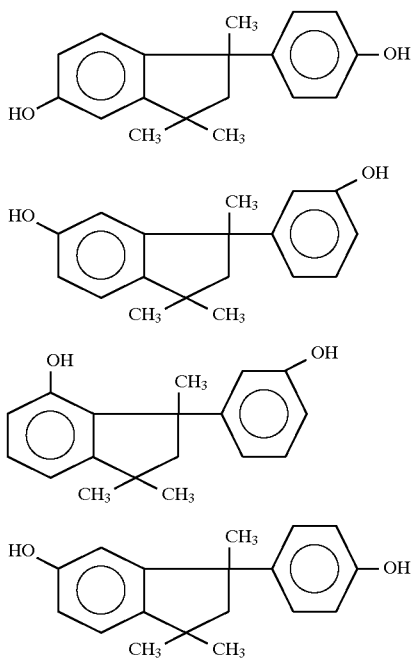

The compounds represented by the general formulae (IV) to (VI) can be used either singly or as a mixture. The compounds represented by the general formula (IV) can be produced according to the method described in U.S. Patent No. 3,288,864 using m- or p-isopropenylphenol or a linear dimer thereof, and the compounds represented by the general formulae (V) to (VI) can be produced according to the method described in JP-A-54-64589 or JP-A-49-101366.

The phenol compounds other than those represented by the general formulae (IV) to (VI), which are usable for addition condensation with a carbonyl compound in the present invention, include, for example, the compounds represented by the general formula (VII):

(VII)

[wherein $E_1$ to $E_6$ represent independently a hydrogen atom, a halogen atom, a straight-chain or branched alkyl or alkenyl group which may be substituted, —OH group or a lower alkylcarbonyl group, provided that at least one of $E_1$ to $E_6$ is —OH group and at least 2 hydrogen atoms are coordinated at the o- or p-position in relation to said —OH group], the compounds represented by the general formula (VIII):

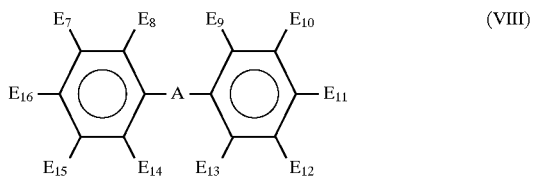

[wherein $E_7$ to $E_{16}$ represent independently a hydrogen atom, a halogen atom, a straight-chain or branched alkyl or alkenyl group which may be substituted, —OH group or a lower alkylcarbonyl group, provided that at least one of $E_7$ to $E_{15}$ is —OH and at least 2 hydrogen atoms are coordinated at the o- or p-position in relation to said —OH group; and A represents an oxygen atom, a sulfur atom or a $C_{1-6}$ alkylene group which may be substituted] and naphthalene compounds.

Examples of the compounds represented by the general formula (VII) include phenol, m-cresol, p-cresol, o-cresol, o-ethylphenol, m-ethylphenol, p-ethylphenol, 2-isopropylphenol, 3-isopropylphenol, 4-isopropylphenol, o-sec-butylphenol, p-sec-butylphenol, o-tert-butylphenol, m-tert-butylphenol, p-tert-butylphenol, 2,5-xylenol, 3,5-xylenol, 3,4-xylenol, 2,3,5-trimethhylphenol, 5-methyl-2-tert-butylphenol, m-methoxyphenol, isoamylphenol, resorcin, 2-methylresorcin and hydroquinone.

Examples of the compounds represented by the general formula (VIII) include 2,2-bis(4-hydroxyphenyl)-propane, etc.

Examples of the naphthalene compounds include 2-naphthol, 1,3-dihydroxynaphthalene, 1,7-dihydroxynaphthol, and 1,5-dihydroxynaphthalene, etc.

These phenol compounds may be used either singly or as a mixture of two or more of them. The molar ratio of the compound of the general formula (IV), (V) or (VI) to said phenol compound is usually 100:0 to 20:80.

The carbonyl compounds usable for the addition condensation in the present invention include ketones such as acetone, methyl ethyl ketone, methyl butyl ketone, methyl isobutyl ketone and methyl isopropyl ketone; and aliphatic and aromatic aldehydes such as formaldehyde, paraformaldehyde, glyoxal, acetaldehyde, propylaldehyde, benzaldehyde, phenylacetaldehyde, α-phenylpropylaldehyde, β-phenylpropylaldehyde, o-hydroxy-benzaldehyde, m-hydroxybenzaldehyde, p-hydroxybenzaldehyde, glutaraldehyde, o-methylbenzaldehyde and p-methylbenzaldehyde, etc. Of these compounds, aldehydes are preferred in view of reaction rate. Formaldehyde is especially preferred because of easy commercial availability. The carbonyl compounds may be used either singly or as a mixture of two or more of them. The amount of the carbonyl compound used for the addition condensation is usually 0.2 to 3 moles, preferably 0.5 to 2 moles to one mole of the phenol compound.

As catalyst for the addition condensation, there can be used organic acids (e.g., formic acid, acetic acid, oxalic acid, trichloroacetic acid, p-toluenesulfonic acid, etc.), inorganic acids (e.g., hydrochloric acid, sulfuric acid, perchloric acid, phosphoric acid, etc.) and divalent metal salts (e.g., zinc acetate, magnesium acetate, etc.). Among them, oxalic acid or acetic acid is preferred. These catalysts may be used either singly or as a mixture of two or more of them. The amount of the catalyst used is preferably 0.1 to 50 wt %, more preferably 0.5 to 30 wt % based on the phenol compound.

The addition condensation is carried out in bulk form or in a solvent. The solvents usable for this purpose include toluene, xylene, ethyl cellosolve, n-propyl alcohol, n-butyl alcohol, i-butyl alcohol, n-hexyl alcohol, dipropyl ether, dibutyl ether, diglyme, n-heptane, n-octane, methyl isobutyl ketone, etc.

The addition condensation is usually carried out at 60°–120° C., but in case of using a solvent, it is preferably carried out at 80°–110° C. under reflux. The reaction time, although variable depending on the molecular weight of the novolak resin to be produced, is usually 2 to 30 hours.

The preferred weight-average molecular weight of the novolak resin produced, calculated as polystyrene, is 1,000 to 10,000.

The alkali-soluble resins usable for the photosensitive resin composition for color filter according to the present invention include, beside aforesaid novolak resins, the mixtures of said novolak resins and alkali-soluble vinyl polymers.

The alkali-soluble vinyl polymers include styrene-p-hydroxystyrene copolymer (such as MARUKALYNCUR-CST produced by Maruzen Sekiyu KK), styrene-maleic anhydride copolymer (such as SMA-2625 and SMA-17352 produced by Atochemi Co., Ltd), acrylic monomer and p-vinylphenyl copolymers described in JP-B-3-49528 (such as MARUKALYNCUR-CMM produced by Maruzen Sekiyu KK), methyl methacrylate (or methyl acrylate) and maleic anhydride copolymer, partial esterification products of these copolymers and alcohols having $C_{1-10}$ alkyl or cycloalkyl groups, vinylphenol copolymers such as those having the structure represented by the following formula:

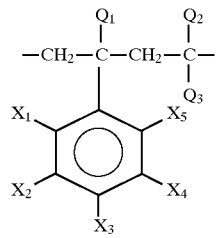

(wherein $Q_1$ and $Q_{or}$ represent independently a hydrogen atom or an alkyl group; $Q_3$ represents an alkyl, aryl, alkoxy, hydroxyalkyl or alkylcarbonyloxy group; and $X_1$ to $X_5$ represent independently a hydrogen atom, a halogen atom, an alkyl group or a hydroxyl group provided that at least one of them is a hydroxyl group), resins produced by hydrogenating polyvinylphenols (such as MARUKALYNCUR-PHS-C produced by Maruzen Sekiyu KK) and polyvinylphenols (such as MARUKALYNCUR-M produced by Maruzen Sekiyu KK). These alkali-soluble vinyl polymers may be used either singly or as a combination of two or more of them. If necessary, it is possible to select an alkali-soluble vinyl polymer having a molecular weight of the order of 500 to 10,000.

The solvents usable in the photosensitive resin composition for color filter according to the present invention include, for example, methyl cellosolve, ethyl cellosolve, methyl cellosolve acetate, ethyl cellosolve acetate, diethylene glycol dimethyl ether, ethylene glycol monoisopropyl ether, propylene glycol monomethyl ether, N,N-dimethylacetamide, N-methylpyrrolidone, γ-butyrolactone, methyl isobutyl ketone, methyl ethyl ketone, cyclopentanone, cyclo-hexanone, xylene, 2-heptanone, ethyl acetate, n-butyl acetate, propylene glycol monomethyl acetate, propylene glycol monoethyl acetate, methyl lactate, ethyl lactate, ethyl pyruvate, dimethyl sulfoxide, dioxane, dimethyl-formamide, etc. These solvents may be used either singly or as a combination of two or more of them.

As dyes, there can be used, for instance, C. I. Solvent Colours shown in Color Index. As pigments, there can be used, for instance, C. I. Pigment Colours shown in Color Index.

The positive photosensitive resin composition for color filter preferably contains a crosslinking agent, and may further contain a photo-induced acid precursor, in addition to said alkali-soluble resin, solvent, dye and pigment.

The negative photosensitive resin composition for color filter preferably contains a crosslinking agent and a photo-induced acid precursor, in addition to said alkali-soluble resin, solvent, dye and pigment.

The crosslinking agents usable in the present invention include, for example the compounds having a group represented by the following formula:

(wherein R represents a hydrogen atom or a lower alkyl group; and s represents an integer of 1 to 4) and melamines.

Examples of the compounds having the group of the above formula include the compounds represented by the following formula:

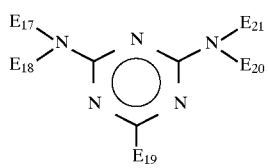

[wherein $E_{19}$ represents —N($E_{22}$)($E_{23}$) or an aryl group which may be substituted; and $E_{17}$, $E_{18}$, $E_{20}$, $E_{21}$, $E_{22}$ and $E_{23}$ represent independently a hydrogen atom or —(CH$_2$)$_s$OR wherein R and s are as defined above] and the compounds of the following formulae:

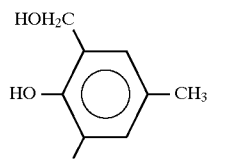

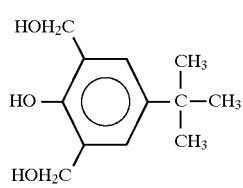

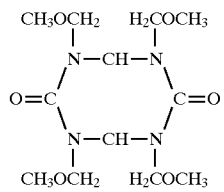

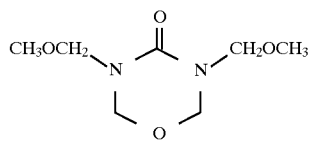

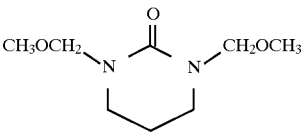

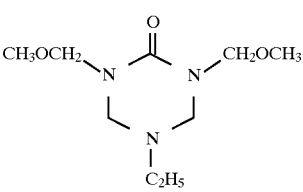

Of these compounds, those represented by the general formula (IX) are preferred.

Examples of the aryl groups represented by $E_{19}$ are phenyl, 1-naphthyl and 2-naphthyl groups. The substituents include lower alkyl and alkoxyl groups, nitro group and halogen atoms. Preferred examples of the lower alkyl groups represented by R are methyl and ethyl groups.

Preferred examples of the compounds represented by the general formula (IX) include the following:

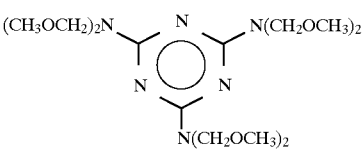

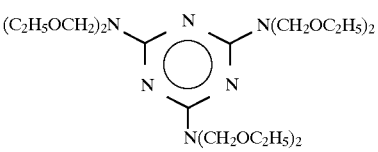

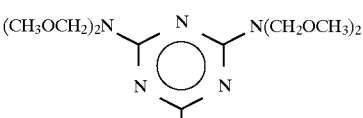

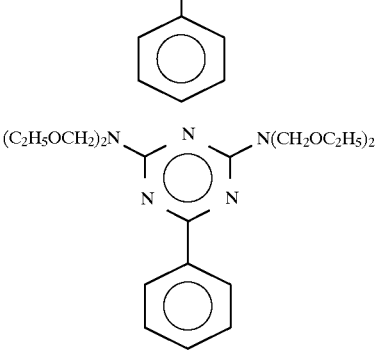

In the compounds represented by the general formula (IX), the methylol moiety can be produced by reacting a melamine or benzoguanamine derivative with formaldehyde under the basic conditions. The methylol ether moiety can be produced by reacting said methylol moiety with an alcohol. The compounds represented by the formulae (i) and (ii) can be produced by reacting p-cresol or 4-tert-butylphenol with formaldehyde under the basic conditions. The compounds represented by the formulae (iii) and (vi) are described in JP-A-1-293339.

The crosslinking agents may be used either singly or as a mixture of two or more of them.

As photo-induced acid precursor, there can be used any of those capable of generating an acid on exposure to light such as ultraviolet light. They include, for instance, the compounds disclosed in JP-A-62-164045, JP-A-63-153542, JP-A-53-133428, Bull. Chem. Soc. Japan, 42, 2924 (1969), U.S. Pat. No. 3,987,037 and F. C. Schaefer et al: J. Org. Chem., 29 , 1527 (1964); the organic halides disclosed in U.K. Patent 1,388,492, such as 2-phenyl-4,6-bis(trichloromethyl)-s-triazine, 2-(p-acetylphenyl)-4,6-bis(trichloromethyl)-s-triazine, 2-(p-chlorophenyl)-4,6-bis(trichloromethyl)-s-triazine, 2-(p-tolyl)-4,6-bis(trichloromethyl)-s-triazine, 2-(p-methoxyphenyl)-4,6-bis(trichloromethyl)-s-triazine, 2-(2',4'-dichlorophenyl)-4,6-bis(trichloromethyl)-s-triazine, 2,4,6-tris(trichloromethyl)-s-triazine, 2-methyl-4,6-bis(trichloromethyl)-s-triazine, 2-(α, α,β-trichloroethyl)-4,6-bis(trichloromethyl)-s-triazine, 2-n-nonyl-4,6-bis(trichloromethyl)-s-triazine, 2-methyl-4,6-bis(tribromomethyl)-s-triazine, 2,4,6-tris(tri-bromomethyl)-s-triazine, 2,4,6-tris(dibromomethyl)-s-triazine, 2-amino-4-methyl-6-tribromomethyl-s-triazine, 2-methoxy-4-methyl-6-trichloromethyl-s-triazine, 2-styryl-4,6-bis(trichloromethyl)-s-triazine, 2-(p-methylstyryl)-4,6-bis(trichloromethyl)-s-triazine, 2-(p-methoxystyryl)-4,6-bis(trichloromethyl)-s-triazine, 2-(p-methoxystyryl)-4-amino-6-trichloromethyl-s-triazine, 2-(4-methoxy-naphtho-1-yl)-4,6-bis-trichloromethyl-s-triazine, 2-(4-ethoxy-naphtho-1-yl)-4,6-bis-trichloro-methyl-s-triazine, 2-[4-(2-ethoxyethyl)naphtho-1-yl]-4,6-bis(trichloromethyl)-s-triazine, 2-(4,7-dimethoxy-naphtho-1-yl)-4,6-bis(trichloromethyl)-s-triazine, and 2-(acenaphtho-5-yl)-4,6-bis(trichloromethyl)-s-triazine; trifluoromethanesulfonic acid esters disclosed in JP-A-3-142344, such as

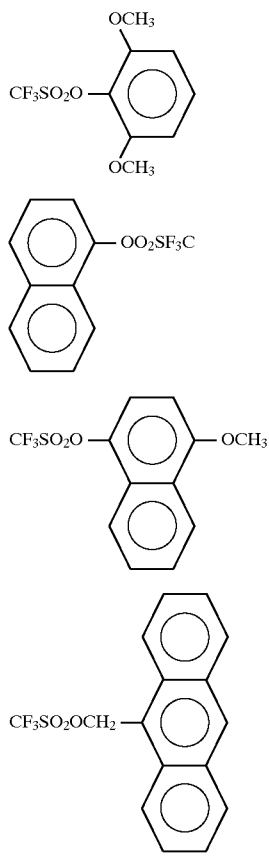

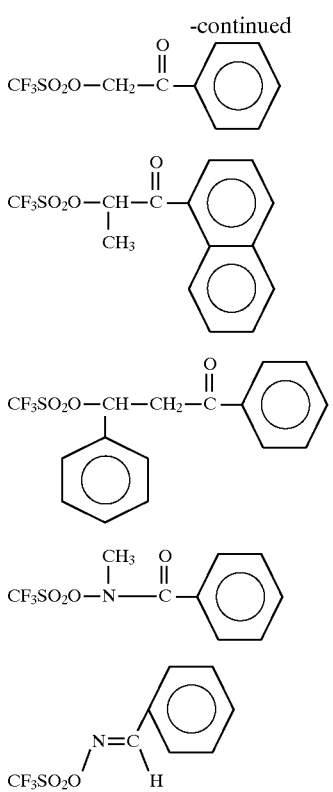

and the arylsulfonyl acetophenones disclosed in Jap. Pat. Appln. No. 3-142316, such as

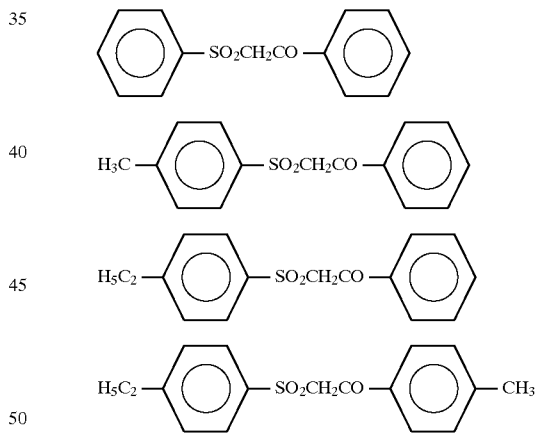

Examples of the quinonediazide compounds include o-naphthoquinonediazido-5-sulfonic acid esters and sulfoneamides, and o-naphthoquinonediazido-4-sulfonic acid esters and sulfoneamides. These esters and amides can be produced by the known methods using the phenol compounds such as disclosed in JP-A-2-84650 and JP-A-3-49437.

The alkali-soluble resin (aforesaid novolak resin and alkali-soluble vinyl polymer) and the crosslinking agent are usually dissolved in a solvent at a rate of about 2–50 wt % and about 2–30 wt %, respectivelyly. The quinonediazide compound, the photo-induced acid precursor and the dye (or pigment) are usually added at a rate of about 2–30 wt%, about 2–30 wt % and about 2–50 wt %, respectively, based on the solvent.

Aforesaid photosensitive resin composition may contain various kinds of additives commonly used in the art, such as smoothing agent for affording uniform coatability to the composition.

When the positive photosensitive resin composition is exposed to light, the exposed portion is removed while the non-exposed portion is allowed to remain as a positive color filter because of the difference produced between said portions in solubility in the alkaline developing solution by exposure. Specifically, said quinonediazide compound is decomposed on exposure to light to become soluble in the alkaline developing solution, but in the non-exposed portion it acts to prevent the novolak resin from being dissolved in the alkaline developing solution. When the non-exposed portion is subjected to whole-area exposure, the remaining quinonediazide compound is now decomposed, and in case a photo-induced acid precursor is contained, it generates an acid which acts to harden the positive color filter.

On the other hand, no quinonediazide compound is contained in the negative photosenstive resin composition, so that contrary to the case of the positive photosensitive resin composition, the exposed portion remains as a negative color filter.

For.exposure, there can be used, for instance, ultraviolet or far ultraviolet light from a mercury lamp, electron beams, X-rays and the like.

EXAMPLES

The present invention is further illustrated below with reference to the examples thereof, which examples however are in no way intended to limit the scope of the invention. In the following Examples, all "parts" are by weight.

In preparation of a color filter, a photo-sensitive resin composition was spin coated on a silicon wafer and the coating was heated to remove the solvent by evaporation , then exposed to light through a mask and developed (followed by whole-area exposure in the case of positive color filter) to obtain a color filter. Exposure was conducted by using I-line Exposure Stepper (HITACHI LD-5010-i (NA=0.40) mfd. by Hitachi Ltd). For development, an alkaline developer SOPD produced by Sumitomo Chemical Co., Ltd. was used.

Referential Example 1

A mixture of 53.6 g (0.2 mol) of the compound represented by the following formula (1) (a p-OST cyclic dimer produced by Mitsui Toatsu Chemicals, Inc.), 6.08 g (0.003 mol) of 5% oxalic acid and 13.0 g (0.16 mol) of 37% formalin was heated and stirred to obtain a novolak resin (weight-average molecular weight calculated in terms of polystyrene: 3,300).

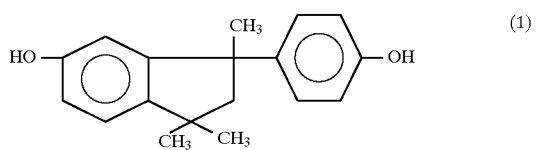
(1)

Referential Example 2

A formaldehyde novolak resin (weight-average molecular weight calculated in terms of polystyrene: 3,000) was obtained by using a mixture of the two compounds of the following formulae obtained by reacting 108.5 g of m-isopropenylphenol and 4.4 ml of a boron trifluoride-diethyl ether complex (BF$_3$ content: 47%) in toluene (540 ml).

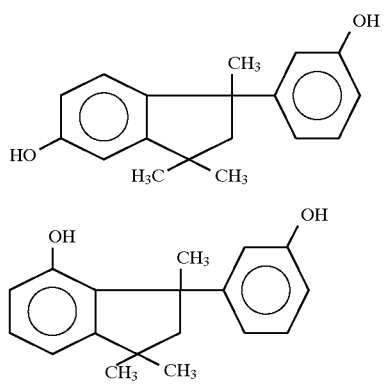
(3)

Example 1

A mixture of 1.0 part of the novolak resin obtained in Referential Example 1, 0.6 part of an o-naphthoquinonediazido-5-sulfonic acid ester (having average 2 hydroxyl groups esterified) produced by using the compound of the following formula:

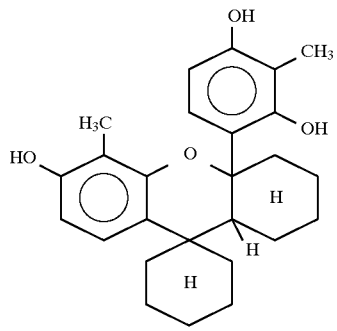

0.3 part of hexamethoxymethylolmelamine, 3 parts of imethylformamide, 4 parts of ethyl lactate and 0.75 art of Oleosol Fast Blue RL produced by Taoka Chemical Co., Ltd. was filtered under pressure by using a membrane filter to obtain a cyan-colored positive photosensitive resin composition.

This composition was spin coated on a silicon wafer, exposed to light and developed with an alkaline developing solution to obtain a cyan-colored positive pattern having a resolution of 0.8 μm. This positive pattern was subjected to whole-area exposure and then hardened by heating at 150° C. for 10 minutes. The thus obtained color filter suffered no discoloration even when heated at 200° C. for 40 minutes and had excellent transparency (light transmitting properties) at 400 nm.

Example 2

The procedure of Example 1 was carried out except that the novolak resin obtained in Referential Example 2 was used in place of the novolak resin obtained in Referential Example 1 to obtain a cyan-colored positive photosensitive resin composition.

This composition was spin coated on a silicon wafer, exposed to light and developed with an alkaline developing solution to obtain a cyan-colored positive pattern having a resolution of 0.8 μm. This positive pattern was subjected to whole-area exposure and hardened by heating at 150° C. for 10 minutes. The thus obtained color filter suffered no discoloration even when heated at 200° C. for 40 minutes and had excellent transparency (light transmitting properties) at 400 nm.

Example 3

The procedure of Example 1 was followed except that a dimethylformamide/ethyl cellosolve acetate mixture (1/1) was used in place of the mixture of dimethylformamide and ethyl lactate, that o-naphtho-quinonediazido-5-sulfonic acid ester was not used, and that 0.2 part of a photo-induced acid precursor represented by the following formula:

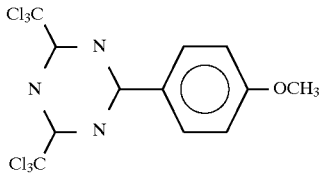

was added to obtained a cyan-colored negative photosensitive resin composition.

This composition was spin coated on a silicon wafer, exposed to light, then heated at 120° C. for 2 minutes and developed with an alkaline developing solution to obtain a cyan-colored filter having a resolution of 0.8 μm. The thus obtained color filter was not discolored even when heated at 200° C. for 40 minutes and had excellent transparency (light transmitting properties) 400 nm.

Comparative Example 1

A cyan-colored positive photosensitive resin composition was obtained in the same way as in Example 1 except for use of a novolak resin (weight-average moleular weight calculated in terms of polystyrene: 4,300) obtained from a mixture of m-cresol/p-cresol/formaldehyde (reaction molar ratio=5/5/7.5), and this composition was treated in the same way as in Example 2 to obtain a cyan-colored color filter. When this color filter was heated at 200° C. for 40 minutes, its light transmitting properties (percent transmission) decreased by 15%.

Example 4

A mixture of 0.47 part of the novolak resin obtained in Referential Example 1, 0.7 part of MARUKALYNCUR-CST-70 (molecular weight: about 2,300) produced by Maruzen Sekiyu KK, 0.6 part of o-naphtho-quinonediazido-5-sulfonic acid ester used in Example 1, 0.3 part of hexamethoxymethylolmelamine, 3 parts of dimethylformamide, 4 parts of ethyl lactate and 0.75 part of a dye Oleosol Fast Blue RL produced by Taoka Chemical Co., Ltd. was filtered under pressure by using a membrane filter to obtain a cyan-colored positive photosensitive resin composition.

This composition was spin coated on a silicon wafer and exposed to light, and the exposed portion was removed with the developing solution to obtain a positive colored pattern having a resolution of 0.8 μm.

This colored pattern was subjected to whole-area exposure and then heated at 150° C. for 10 minutes to obtain a cyan-colored color filter. This color filter suffered no discoloration even when heated at 200° C. for 4 hours, and its percent transmission at 400 nm remained almost unchanged.

Example 5

A cyan-colored color filter was obtained in the same way as in Example 4 except for use of MARUKALYNACUR-CMM (molecular weight: about 5,300) in place of MARUKALYNCUR-CST-70. This color filter gave the same test results as above regarding resolution, heat resistance and percent transmission.

Example 6

A cyan-colored color filter was obtained in the same way as in Example 4 except for use of MARUKALYNCUR-PHS-C (molecular weight: about 5,000) in place of MARUKALYNCUR-CST-70, and the same test results as above were obtained with this color filter regarding resolution, heat resistance and percent transmission.

Example 7

A cyan-colored negative photosensitive resin composition was obtained in the same way as in Example 4 except that 0.2 part of the photo-induced acid precursor employed in Example 3 was used in place of o-naphthoquinonediazido-5-sulfonic acid ester (quinonediazide compound), and that a 1/1 mixture of dimethylformamide/ethyl cellosolve acetate was used in place of the mixture of dimethylformamide and ethyl lactate.

This composition was spin coated on a silicon wafer, exposed to light and heated at 120° C. for 2 minutes, and then the non-exposed portion was removed with the developing solution to obtain a cyan-colored negative color filter having a resolution of 0.8 μm. This color filter suffered no discoloration even when heated at 200° C. for 4 hours, and its percent transmission at 400 nm remained almost unchanged.

Comparative Example 2

A cyan-colored positive color filter (resolution:0.8 μm) was obtained in the same way as in Example 4 except that a novolak resin (weight-average molecular weight calculated in terms of polystyrene: 4,300) obtained from a mixture of m-cresol/p-cresol/formaldehyde (reaction molar ratio =5/5/7.5) was used in place of the novolak resin obtained in Referential Example 1. When this color filter was heated at 200° C. for 4 hours, its percent transmission at 400 nm decreased by 10%.

Example 8

A mixture of 1.0 part of the novolak resin obtained in Referential Example 1, 0.6 part of o-naphthoquinonediazido-5-sulfonic acid ester (having average 2 hydroxyl groups esterified) produced by using the compound represented by the following formula:

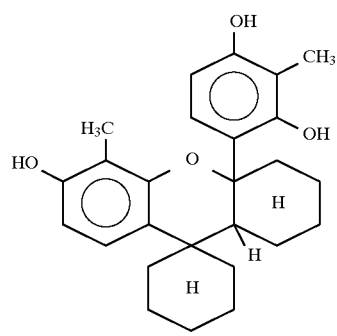

0.3 part of hexamethoxymethylolmelamine, 10 parts of ethyl cellosolve acetate and 6 parts of the pigment dispersion described below was filtered under pressure by using a membrane filter to obtain a blue-colored positive photosensitive resin composition.

This composition was spin coated on a silicon wafer, exposed to light and developed with an alkaline developing solution to obtain a blue-colored positive pattern having a resolution of 5 μm. This positive pattern was subjected to whole-area exposure and hardened by heating at 150° C. for 10 minutes. The thus obtained color filter was not discolored even when heated at 200° C. for 40 minutes and had excellent transparency (light transmitting properties) at 400 nm.

Preparation of pigment dispersion 20 parts of a 95/5 mixture of C. I. Pigment Blue 15 and C. I. Pigment Violet 23, 5 parts of a sorbitan dispersant and 75 parts of ethyl cellosolve acetate were premixed and treated according to Beads-Mill method to prepare a blue dispersion.

Example 9

The procedure of Example 8 was followed except for use of the novolak resin obtained in Referential Example 2 in place of the novolak resin obtained in Referential Example 1 to obtain a blue-colored positive photosensitive resin composition This composition was spin coated on a silicon wafer, exposed to light and developed with an alkaline developing solution to obtain a blue-colored positive pattern having a resolution of 5 μm. This positive pattern was subjected to whole-area exposure and then heated at 150° C. for 10 minutes. The thus obtained color filter suffered no discoloration even when heated at 200° C. for 40 minutes and had excellent transparency (light transmitting properties) at 400 nm.

Example 10

The procedure of Example 8 was followed except that o-naphthoquinonediazido-5-sulfonic acid ester was not added, and that 0.2 part of a photo-induced acid precursor represented by the following formula:

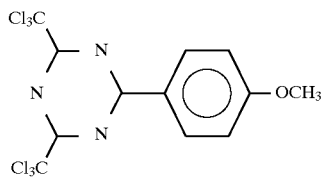

was added to obtain a blue-colored negative photosensitive resin composition.

This composition was spin coated to a silicon wafer, exposed to light, heated at 120° C. for 2 minutes and then developed with an alkaline developing solution to obtain a blue-colored color filter having a resolution of 5 μm. The thus obtained color filter suffered no discoloration even when heated at 200° C. for 40 minutes and had excellent transparency (light transmitting properties) at 400 nm.

Comparative Example 3

A blue-colored positive photosensitive resin composition was obtained in the same way as in Example 8 except for use of a novolak resin (weight-average molecular weight calculated in terms of polystyrene: 4,300) obtained from a mixture of m-cresol/p-cresol/formaldehyde (reaction molar ratio=5/5/7.5), and this composition was treated in the same way as in Example 2 to obtain a blue color filter. When this color filter was heated at 200° C. for 40 minutes, its light transmitting properties (percent transmission) at 400 nm decreased by 15%.

Example 11

A mixture of 0.47 part of the novolak resin obtained in Referential Example 1, 0.7 part of MARUKALYNCUR-CST-70 (molecular weight: about 2,300) produced by Maruzen Sekiyu KK, 0.6 part of o-naphtho-quinonediazido-5-sulfonic acid ester used in Example 1, 0.3 part of hexamethoxy methylolmelamine, 10 parts of ethyl cellosolve acetate and 6 parts of the pigment dispersion used in Example 8 was filtered under pressure by using a membrane filter to obtain a blue-colored positive photosensitive resin composition.

This composition was spin coated on a silicon wafer and exposed to light and the exposed portion was removed with an alkaline developing solution to obtain a positive colored pattern having a resolution of 5 μm. This pattern was subjected to whole-area exposure and then heated at 150° C. for 10 minutes to obtain a blue color filter. This color filter suffered no discoloration even when heated at 200° C. for 4 hours and its percent transmission at 400 nm remained almost unchanged.

Example 12

The procedure of Example 11 was followed except for use of MARUKALYNCUR-CMM (molecular weight: about 5,300) produced by Maruzen Sekiyu KK in place of MARUKALYCUR-CST-70 to obtain a blue color filter. This color filter gave the same test results as above regarding resolution, heat resistance and percent transmission.

Example 13

The procedure of Example 11 was followed except for use of MARUKALYNCUR-PHS-C (molecular weight: about 5,000) produced by Maruzen Sekiyu KK in pace of MARUKALYNCUR-CST-70 to obtain a blue color filter. This color filter gave the same test results as above regarding resolution, heat resistance and percent transmission.

Example 14

The procedure of Example 11 was followed except that 0.2 parts of the photo-induced acid precursor used in Example 10 was used in place of o-naphthoquinonediazido-5-sulfonic acid ester (quinone-diazide compound) to obtain a blue-colored negative photosensitive resin composition.

This composition was spin coated on a silicon wafer, exposed to light and heated at 120° C. for 2 minutes and then the non-exposed portion was removed with a developing solution to obtain a negative blue color filter having a resolution of 5 μm. This color filter suffered no discoloration even when heated at 200° C. for 4 hours, and its percent transmission at 400 nm remained almost unchanged.

Comparative Example 4

The procedure of Example 11 was followed except that a novolak resin (weight-average molecular weight calculated in terms of polystyrene: 4,300) obtained from a mixture of m-cresol/p-cresol/formaldehyde (reaction molar ratio=5/5/7.5) was used in place of the novolak resin obtained in Referential Example 1 to obtain a blue-colored positive color filter (resolution: 5 μm). When this color filter was heated at 200° C. for 4 hours, its percent transmission at 400 nm decreased by 15%.

INDUSTRIAL APPLICABILITY

By using the photosensitive resin composition according to the present invention, there can be obtained a color filter having excellent resolution, heat resistance and transparency.

We claim:

1. A process for producing a color filter for use in charge-coupled devices or use in liquid crystal display devices which comprises applying a positive photosensitive resin composition as defined below on a semiconductor substrate, subjecting the resin composition to irradiation with light and then developing the irradiated resin composition, wherein the positive photosensitive resin composition consists essentially of a quinonediazide compound and a novolak resin having at least one type of recurring unit selected from the group of the recurring units represented by the general formulae (I)–(III):

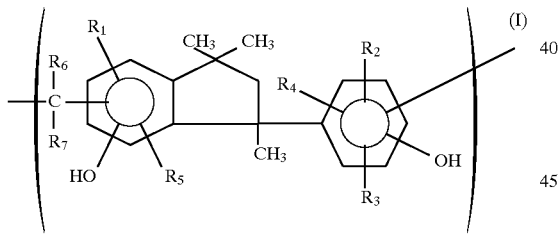

wherein $R_1$ to $R_5$ represent independently a hydrogen atom, a halogen atom, an unsubstituted straight-chain alkyl group, a substituted straight-chain alkyl group, a substituted branched alkyl group, an unsubstituted branched alkyl group, an unsubstituted straight-chain alkenyl group, an unsubstituted branched alkenyl group, a substituted straight-chain alkenyl group, a substituted branched alkenyl group, or an acetyl group; and $R_6$ and $R_7$ represent independently a hydrogen atom, an unsubstituted alkyl group, a substituted alkyl group, a benzyl group or a phenyl group provided that

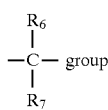

is coordinated at the o- or p-position in relation to the —OH group;

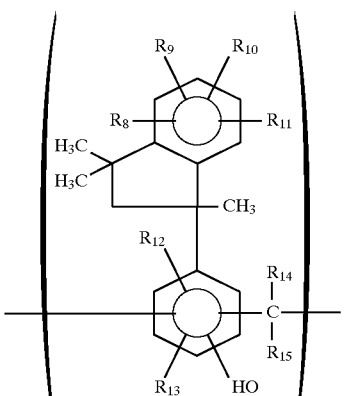

wherein $R_8$ to $R_{13}$ represent independently a hydrogen atom, a halogen atom, an unsubstituted straight-chain alkyl group, a substituted straight-chain alkyl group, a substituted branched alkyl group, an unsubstituted branched alkyl group, an unsubstituted straight-chain alkenyl group, an unsubstituted branched alkenyl group, a substituted straight-chain alkenyl group, a substituted branched alkenyl group, or an acetyl group; and $R_{14}$ and $R_{15}$ represent independently a hydrogen atom, an unsubstituted alkyl group, a substituted alkyl group, a benzyl group or a phenyl group provided that

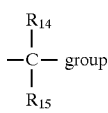

is coordinated at the o- or p-position in relation to the —OH group; and

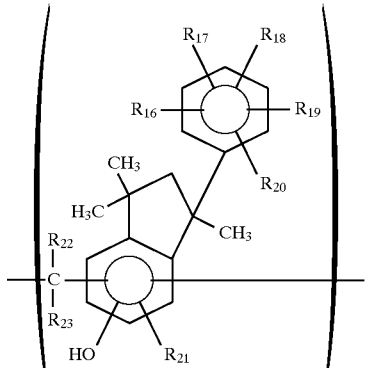

wherein $R_{16}$ to $R_{21}$ represent independently a hydrogen atom, a halogen atom, an unsubstituted straight-chain alkyl group, a substituted straight-chain alkyl group, a substituted branched alkyl group, an unsubstituted branched alkyl group, an unsubstituted straight-chain alkenyl group, an unsubstituted branched alkenyl group, a substituted straight-chain alkenyl group, a substituted branched alkenyl group, or an acetyl group; and $R_{22}$ and $R_{23}$ represent independently a hydrogen atom, an alkyl group which may be substituted, a benzyl group or a phenyl group provided that

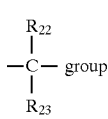

group is coordinated at the o- or p-position in relation to the —OH group and having a molecular weight of about 1,000–50,000; a solvent; and a dye or pigment present in an amount of 2–50 wt. % based on the solvent; wherein said substituted groups are substituted with substituents selected from the group consisting of halogen, hydroxy, —SH, phenyl and lower alkylthio.

2. A process for producing a color filter according to claim 1, wherein the positive photosensitive resin composition further consists essentially of an alkali-soluble vinyl polymer.

3. A process for producing a color filter according to claim 2, wherein the alkali-soluble vinyl polymer is polyvinylphenol, a resin obtained by hydrogenating polyvinylphenol, or a vinylphenol copolymer.

4. A process for producing a color filter according to claim 1, wherein the quinonediazide compound is an o-naphthoquinonediazide compound.

5. A process for preparing a color filter according to claim 1, which further comprises heating the photosensitive resin composition to remove the solvent after applying on the substrate and before subjecting to irradiation, and exposing the coated substrate to light through a mask before developing the exposed coated substrate, and if necessary, a step of whole-area exposure.

* * * * *